United States Patent
Furuhata et al.

(10) Patent No.: US 7,972,917 B2
(45) Date of Patent: Jul. 5, 2011

(54) METHOD FOR MANUFACTURING SEMICONDUCTOR DEVICE AND SEMICONDUCTOR DEVICE

(75) Inventors: Tomoyuki Furuhata, Suwa (JP); Hideyuki Akanuma, Minowa-machi (JP); Hiroaki Nitta, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 23 days.

(21) Appl. No.: 12/492,080

(22) Filed: Jun. 25, 2009

(65) Prior Publication Data

US 2010/0001342 A1    Jan. 7, 2010

(30) Foreign Application Priority Data

Jul. 3, 2008  (JP) .................... 2008-174350

(51) Int. Cl.
*H01L 21/8238*    (2006.01)

(52) U.S. Cl. ........ 438/199; 438/224; 438/227; 438/228; 257/335

(58) Field of Classification Search .................. 438/199, 438/224, 227, 228; 257/335, E21.696, E21.552, 257/E27.014
See application file for complete search history.

(56) References Cited

U.S. PATENT DOCUMENTS

| | | | |
|---|---|---|---|
| 4,918,026 A | | 4/1990 | Kosiak et al. |
| 5,262,345 A | * | 11/1993 | Nasser et al. ................. 438/203 |
| 5,981,997 A | | 11/1999 | Kitamura |
| 6,097,078 A | * | 8/2000 | Sim et al. ...................... 257/548 |
| 6,451,640 B1 | | 9/2002 | Ichikawa |
| 6,461,946 B2 | | 10/2002 | Kitani et al. |
| 6,664,602 B2 | | 12/2003 | Yamashita et al. |
| 6,903,424 B2 | | 6/2005 | Ookubo et al. |
| 7,009,259 B2 | | 3/2006 | Ookubo et al. |
| 7,015,551 B2 | | 3/2006 | Ookubo et al. |
| 2006/0011975 A1 | | 1/2006 | Yonemoto et al. |

FOREIGN PATENT DOCUMENTS

| | | |
|---|---|---|
| JP | 03-201474 A | 9/1991 |
| JP | 09-260651 A | 10/1997 |
| JP | 10-189762 A | 7/1998 |
| JP | 2002-026274 A | 1/2002 |
| JP | 2002-100684 A | 4/2002 |
| JP | 2003-060073 A | 2/2003 |
| JP | 2003-234423 A | 8/2003 |
| JP | 2005-056915 A | 3/2005 |
| JP | 2006-032493 A | 2/2006 |
| JP | 2006-210532 A | 8/2006 |

\* cited by examiner

*Primary Examiner* — Theresa T Doan
(74) *Attorney, Agent, or Firm* — Kilpatrick Townsend & Stockton LLP

(57) ABSTRACT

A method for manufacturing a semiconductor device is disclosed. The method includes: forming a LDMOS region, an offset drain MOS region, and a CMOS region; simultaneously forming a first well in the LDMOS region and the offset drain MOS region; simultaneously forming a second well in the first well of the LDMOS region and the CMOS region; and forming a second well in the CMOS region, wherein a depth of the first well is larger than a depth of the second well and the second well is a retrograde well formed by a high energy ion implantation method.

19 Claims, 13 Drawing Sheets

METHOD FOR MANUFACTURING SEMICONDUCTOR DEVICE AND SEMICONDUCTOR DEVICE

This application claims priority to Japanese Patent Application No: 2008-174350, filed Jul. 3, 2008, the entirety of which is expressly incorporated by reference herein.

BACKGROUND

1. Technical Field

The present invention relates to a method for manufacturing a semiconductor device, and a semiconductor device.

2. Related Art

With increasing demands for reducing power consumption and size of apparatuses in recent years, lateral diffused MOS (LDMOS) transistors have been used instead of NPN type transistors having high current drive ability and being conventionally used.

There have been provided semiconductor devices in which a high voltage output section having a high current consumption and a low voltage output section having a low current consumption are mixedly fabricated on a common semiconductor substrate, for switching the current consumption in accordance with operational conditions of apparatuses. For example, JP-A-2002-100684 discloses a semiconductor device in which a high voltage LDMOS transistor and a low voltage MOS transistor are mixedly fabricated on a common semiconductor substrate.

SUMMARY

An advantage of the invention is to provide a method for manufacturing a semiconductor device in which various kinds of transistors are formed on a common semiconductor substrate, which method can form transistors having good characteristics and high reliability by a simplified process. Another advantage of the invention is to provide a semiconductor device manufactured by the method.

According to a first aspect of the invention, a method for manufacturing a semiconductor device includes: (a) forming an element isolation insulation layer in a semiconductor substrate of a first conductivity type to isolate a laterally diffused metal oxide semiconductor (LDMOS) region, an offset drain metal oxide semiconductor (MOS) region, and a complementary metal oxide semiconductor (CMOS) region from one another; (b) forming a drain side offset insulation layer in the LDMOS region and the offset drain MOS region; (c) simultaneously forming a first well of a second conductivity type in the LDMOS region and the offset drain MOS region; (d) simultaneously forming the second well of the first conductivity type in the first well of the LDMOS region, and the CMOS region; (e) forming a second well of the second conductivity type in the CMOS region; (f) forming an offset later of the first conductivity type under the drain side offset insulation layer of the offset drain MOS region; (g) forming in the second well of the first conductivity type of the LDMOS region a first impurity layer of the second conductivity type, the first impurity layer serving as a source; (h) forming in the first well of the second conductivity type of the LDMOS the first impurity layer of the second conductivity type, the first impurity layer serving as a drain; (i) forming in the second well of the first conductivity type of the CMOS region the first impurity layer of the second conductivity type, the first impurity layer serving as a source and a drain, the steps (g), (h), and (i) being simultaneously conducted; (j) forming in the first well of the second conductivity type of the offset drain MOS region a second impurity layer of the first conductivity type, the second impurity layer serving as a source and a drain; and (k) forming in the second well of the second conductivity type of the CMOS region the second impurity layer of the first conductivity type, the second impurity layer serving as a source and drain, the steps (j) and (k) being simultaneously conducted. In the method, a depth of the first well is larger than a depth of the second well; and the second well is a retrograde well formed by a high energy ion implantation method.

The method can form various kinds of transistors having good characteristics and high reliability on a common semiconductor substrate by a simplified process.

The method may further include: (l) forming a LDMOS transistor having a channel region of the second conductivity type in the LDMOS region; (m) forming an offset drain MOS transistor having a channel region of the first conductivity type in the offset drain MOS region; and (n) forming a first MOS transistor having a channel region of the first conductivity type and a second MOS transistor having a channel region of the second conductivity type in the CMOS region.

In the method, the steps (d) and (e) may include: (o) conducting an ion implanting from a first direction slanted with respect to a thickness direction of the semiconductor substrate; and (p) conducting an ion implantation from a second direction slanted with respect to the thickness direction of the semiconductor substrate. The second direction is different from the first direction.

In the method, the steps (o) and (p) may be conducted while an ion irradiation direction is fixed, a wafer including the semiconductor substrate is relatively moved to the ion irradiation direction.

In the method, the steps (o) and (p) may include: (q) conducting an ion implantation while a first axis in the thickness direction of the semiconductor substrate is slanted with respect to a second axis in the ion irradiation direction; (r) conducting an ion implantation while the first axis in the thickness direction of the semiconductor substrate in step (q) is rotated by 90 degrees around the second axis in the ion irradiation direction as a center; (s) conducting an ion implantation while the first axis in the thickness direction of the semiconductor substrate in step (q) is rotated by 180 degrees around the second axis in the ion irradiation direction as the center; and (t) conducting an ion implantation while the first axis in the thickness direction of the semiconductor substrate in step (q) is rotated by 270 degrees around the second axis in the ion irradiation direction as the center.

In each of the steps of (q) to (t) of the method, one-fourth of a total ion implantation amount can be implanted.

In the step (d) of the method, the second well of the first conductivity type may be simultaneously formed in the first well of the offset drain MOS region; and the second impurity layer of the first conductivity type serving as the drain may be formed in the second well of the first conductivity type of the offset drain MOS region.

In the step (e) of the method, the second well of the second conductivity type may be simultaneously formed in the first well of the offset drain MOS region; and the second impurity layer of the first conductivity type serving as the source is formed in the second well of the second conductivity type of the offset drain MOS region.

In the method, the second well of the second conductivity type of the offset drain MOS region may be formed so as to surround the second well of the first conductivity type of the offset drain MOS region in plan view; and at least part of a periphery of the second well of the second conductivity type of the offset drain MOS region may be disposed outside of a periphery of the first well of the offset drain MOS region; and the second well of the second conductivity type of the offset drain MOS region may have an impurity concentration larger than an impurity concentration of the first well of the offset drain MOS region.

In the step (e) of the method, the second well of the second conductivity type may be simultaneously formed in the first well of the LDMOS region; and the second impurity layer of the first conductivity type serving as the drain may be formed in the second well of the second conductivity type of the LDMOS region.

In the method, the second well of the second conductivity type of the LDMOS region may be formed so as to surround the second well of the first conductivity type of the LDMOS region in plan view; and at least part of a periphery of the second well of the second conductivity type of the LDMOS region may be disposed outside of a periphery of the first well of the LDMOS region; and the second well of the second conductivity type of the LDMOS region have an impurity concentration larger than an impurity concentration of the first well of the LDMOS region.

In the step (c) of the method, the first well of the second conductivity type may simultaneously be formed in the CMOS region; and the second well of the first conductivity type and the second well of the second conductivity type may be formed in the first well of the CMOS region.

In the step (a) of the method, an element isolation insulation layer may be formed so as to isolate a bipolar transistor region from other regions. In the step (e), the second well of the second conductivity type may be simultaneously formed in the bipolar transistor region. The method may further include forming a base layer of the first conductivity type in the second well of the bipolar transistor region. In the step (g), the first impurity layer of the second conductivity type may be simultaneously formed in the second well of the second conductivity type of the bipolar transistor region so as to serve as a collector and in the base layer so as to serve as an emitter.

In the method, a bipolar transistor of a vertical-type may be formed in the bipolar transistor region.

In the method, the offset layer and the base layer may be simultaneously formed.

In the method, the first well may be formed by a drive-in diffusion method.

In the method, the first well may be formed by a high energy ion implantation method.

According to a second aspect of the invention, a semiconductor device includes: an element isolation insulation layer that is formed on the semiconductor substrate, and isolates a laterally diffused metal oxide semiconductor (LDMOS) region, an offset drain metal oxide semiconductor (MOS) region, and a complementary metal oxide semiconductor (CMOS) region from one another; a drain side offset insulation layer formed in the LDMOS region and the offset drain MOS region; a first well of a second conductivity type formed in the LDMOS region and the offset drain MOS region; a second well of the first conductivity type formed in the first well of the LDMOS region and the CMOS region; a second well of the second conductivity type formed in the CMOS region; an offset layer of the first conductivity type formed under the drain side offset insulation layer of the offset drain MOS region; a first impurity layer of the second conductivity type that is formed in the second well of the first conductivity type of the LDMOS region so as to serve as a source, in the first well of the second conductivity type of the LDMOS region so as to serve as a drain, and in the second well of the first conductivity type of the CMOS region so as to serve as a source and a drain; a second impurity layer of the first conductivity type that is formed in the first well of the offset drain MOS region so as to serve as a source and a drain, and in the second well of the second conductivity type of the CMOS region so as to serve as a source and a drain. In the device, a depth of the first well is larger than a depth of the second well; and the second well is formed by a high energy ion implantation method.

According to a third aspect of the invention, a method for manufacturing a semiconductor device includes: forming an element isolation insulation layer in a semiconductor substrate of a first conductivity type to isolate a laterally diffused metal oxide semiconductor (LDMOS) region, an offset drain metal oxide semiconductor (MOS) region, and a complementary metal oxide semiconductor (CMOS) region from one another; simultaneously forming a first well of a second conductivity type in the LDMOS region and the offset drain MOS region; simultaneously forming a second well of the first conductivity type in the first well of the LDMOS region and the CMOS region; and forming a second well of the second conductivity type in the CMOS region. In the method, depth of the first well is larger than a depth of the second well, and the second well is formed by a high energy ion implantation method.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the invention will now be described with reference to the accompanying drawings.

1. Semiconductor Device

Figure 1:
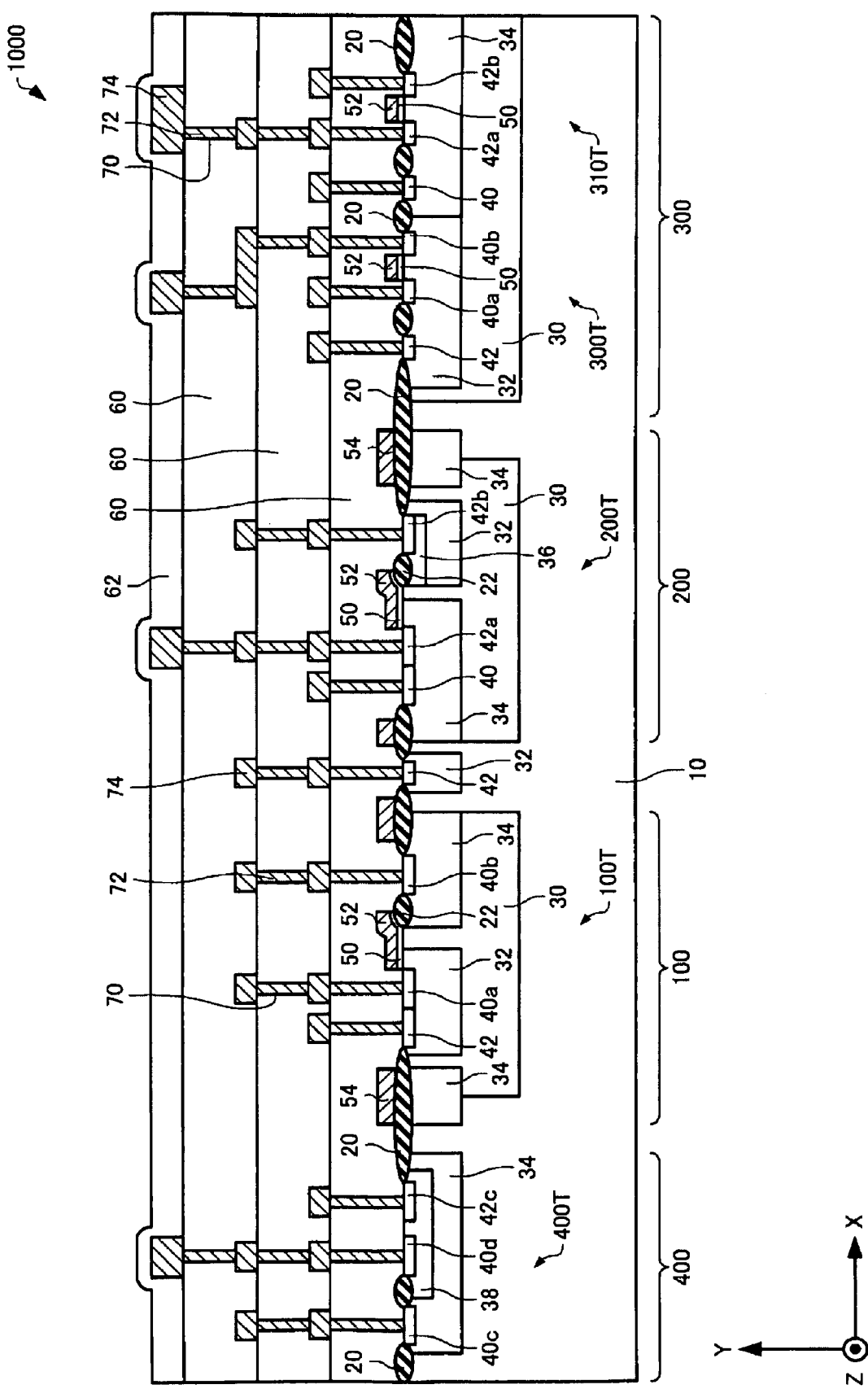
FIG. 1 is a sectional view schematically illustrating a semiconductor device according to an embodiment of the invention.

FIG. 1 is a sectional view schematically showing a semiconductor device 1000 according to an embodiment of the invention. The semiconductor device 1000 includes a semiconductor substrate 10 of P-type and an element isolation insulation layer 20 as shown in FIG. 1. In the embodiment, a first conductivity type is P-type and a second conductivity type is N-type.

The semiconductor substrate 10 is a P-type silicon substrate, for example.

The element isolation insulation layer 20 is formed on the semiconductor substrate 10. The element isolation insulation layer 20 may be a local oxidation of silicon (LOCOS) layer, a semi-recessed LOCOS layer, or a trench insulation layer. In the example shown in FIG. 1, the element isolation insulation layer 20 is a LOCOS layer. The element isolation insulation layer 20 can isolate an LDMOS region 100, an offset drain MOS region 200, a complementary MOS (CMOS) region 300, and a bipolar transistor region 400 from one another.

In the LDMOS region 100, an LDMOS transistor 100T having an N-type channel region (not shown) is formed. In the offset drain MOS region 200, an offset drain MOS transistor 200T having a P-type channel region is formed. In the CMOS region 300, a first MOS transistor 300T having an N-type channel region and a second MOS transistor 310T having a P-type channel region are formed. In the bipolar transistor region 400, a vertical type (NPN-type) bipolar transistor 400T is formed. That is, in the semiconductor device 1000, the LDMOS transistor 100T, the offset drain MOS transistor 200T, the MOS transistors 300T and 310T, and the bipolar transistor 400T are mixedly fabricated on a common substrate (the same chip). While only 5 transistors are conveniently shown in FIG. 1, however, a plurality of various kinds of transistors may be formed on the common substrate.

The element isolation insulation layer 20 may include a conductive layer 54 formed thereon. The conductive layer 54 is made of polysilicon, for example. The conductive layer 54 is also made of, for example, a same material of a gate electrode 52, which is described later. The conductive layer 54, for example, can prevent a conductivity type of a well under the element isolation insulation layer 20 to be reversed.

The semiconductor device 1000 can further include an interlayer insulation film 60, a protective film 62, a contact hole 70, a contact 72, and a wiring layer 74.

The interlayer insulation film 60 is formed on the semiconductor substrate 10. The example shown in FIG. 1 includes 3 interlayer insulation films 60, the number of films, however, is not particularly limited. The interlayer insulation film 60 is, for example, made of silicon oxide. The protective film 62 is formed on the interlayer insulation film 60 and the wiring layer 74. The interlayer insulation film 62 is, for example, made of silicon nitride.

The contact hole 70 is formed in the interlayer insulation film 60. The contact hole 70 includes the contact 72 formed therein, and the contact 72 is connected to the wiring layer 74. The contact 72 and the wiring layer 74 are, for example, made of metal including aluminum, copper, and the like. A voltage can be applied to a specific transistor through the contact 72 from the wiring layer 74.

The LDMOS region 100, the offset drain MOS region 200, the CMOS region 300, and the bipolar transistor region 400 are described below.

1.1 LDMOS Region

First, the LDMOS region 100 is described. In the LDMOS region 100, as described above, the LDMOS transistor 100T having the N-type channel region (not shown) is formed. The LDMOS transistor 100T includes a first well 30 of N-type, a second well 32 of P-type and of a retrograde well, impurity layers 40a and 40b of N-type serving as a source and a drain, a drain side offset insulation layer 22, a gate insulation film 50, and a gate electrode 52, as shown in FIG. 1. The LDMOS transistor 100T can additionally include a second well 34 of N-type and of a retrograde well.

The first well 30 of N-type is formed in the LDMOS region 100 of the semiconductor substrate 10 of P-type. The depth of the first well 30 is larger than that of the second wells 32 and 34. The first well 30 can electrically isolate, for example, the second well 32 of the LDMOS transistor 100T from the semiconductor substrate 10.

Figure 2:
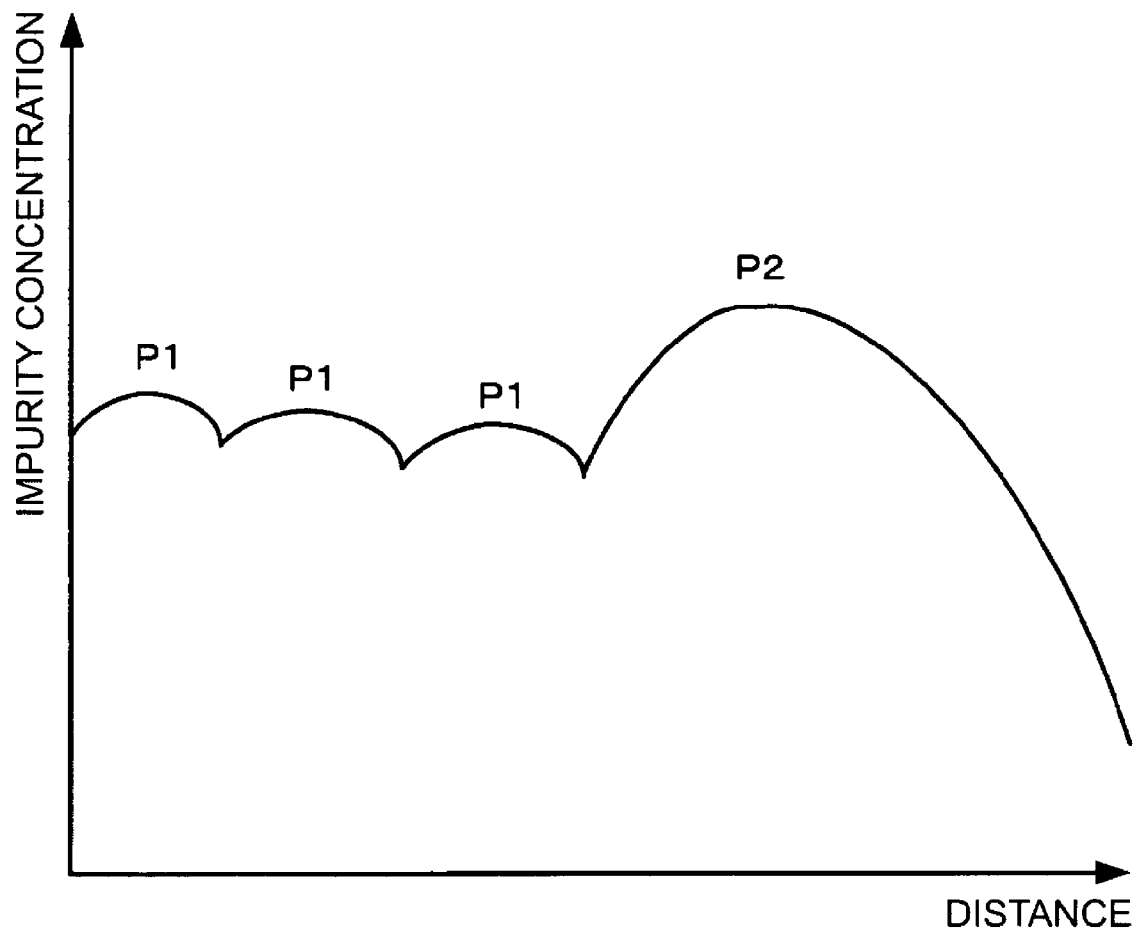
FIG. 2 is a graph showing an impurity concentration in a well of the semiconductor device of the embodiment.

The second well 34 of N-type can be formed in the first well 30 of N-type. The second well 34 can serve as a so-called drift region. The second well 34 includes the impurity layer 40b serving as the drain. Here, FIG. 2 is a graph schematically illustrating a concentration profile of an impurity in a depth direction of the second well 34 of N-type (in a thickness direction of the semiconductor substrate 10, i.e., in a Y direction of FIG. 1). The abscissa axis shows a distance from the surface of the second well 34 (the interface between the second well 34 and the drain side offset insulation layer 22, for example). The ordinate axis shows the concentration of an impurity of the second well 34. The second well 34 is a retrograde well, and has 3 low peaks P1 in a shallow portion (a side close to the surface) and a high peak P2 in a deep portion (a side close to the interface between the second well 34 and the semiconductor substrate 10) as shown in FIG. 2. The impurity concentration of the high peak P2 can be set higher than, for example, that of the first well 30 of N-type. Having the low peak P1, the second well 34 can have, for example, a function to adjust a threshold value of the LDMOS transistor 100T, a function to suppress a punch through, and a function as a channel stopper. The low peak P1 in the shallow portion does not lower the resistance at a side close to the surface more than necessary. As a result, a breakdown voltage of the LDMOS transistor 100T can be saved. In addition, having the high peak P2, the second well 34 can have a function to lower the resistance in the operation of the LDMOS transistor 100T (ON resistance). That is, because of the impurity concentration having the peak in the shallow portion and the peak in the deep portion, the second well 34 can save the breakdown voltage and lower the resistance in the operation. In other words, the LDMOS transistor 100T can adjust the balance between the breakdown voltage and the resistance in the operation.

Figure 3:
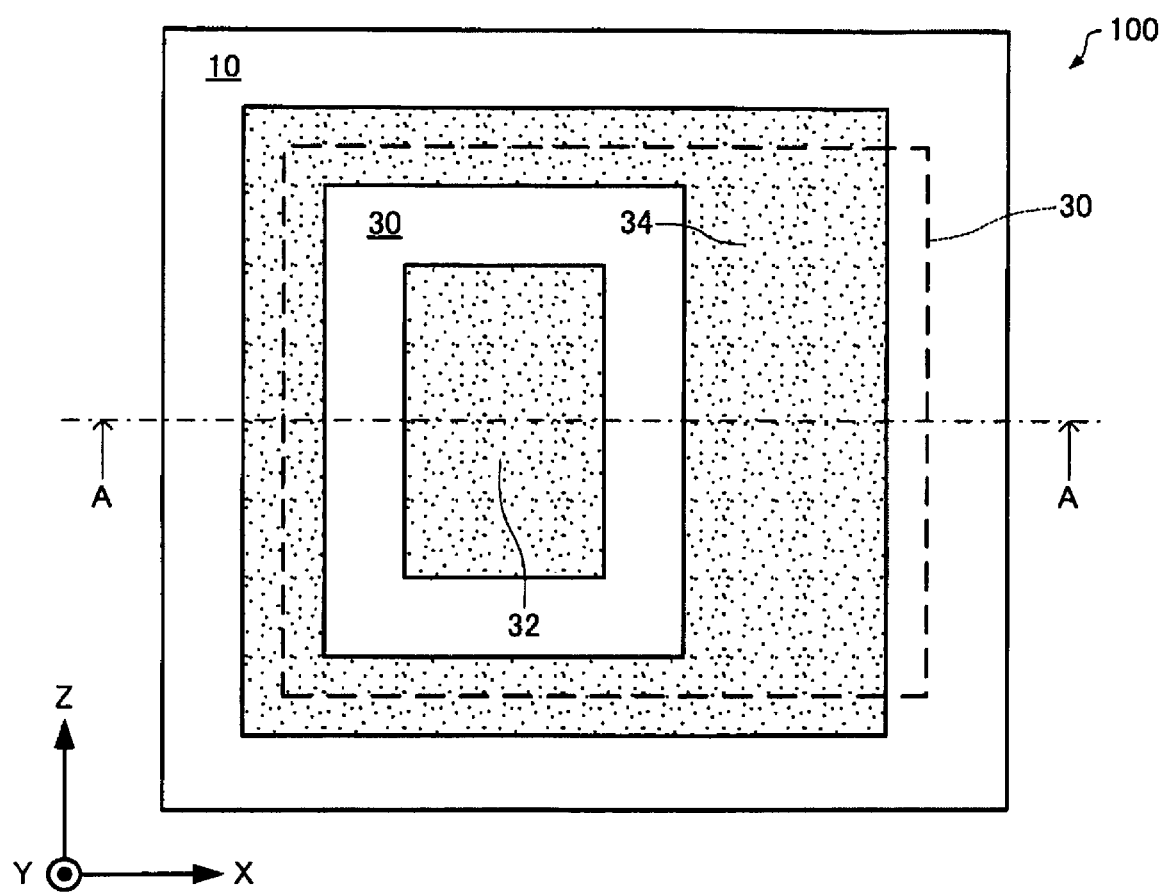
FIG. 3 is a sectional view schematically illustrating a part of the semiconductor device according to the embodiment.

FIG. 3 is a plan view schematically showing the LDMOS region 100 of the semiconductor device 1000. In FIG. 3, only the semiconductor substrate 10 of P-type, the first well 30 of N-type, the second well 34 of N-type and the second well 32 of P-type are illustrated for the sake of convenience. Here, FIG. 1 is a sectional view taken along the line A-A of FIG. 3. The second well 34 is formed so as to surround the second well 32 in plan view as shown in FIG. 3. At least part of the periphery of the second well 34 is disposed outside of the periphery (dashed line) of the first well 30 in plan view. The impurity concentration of the second well 34 is larger than that of the first well 30. Having the second well 34, the LDMOS transistor 100T can reduce a width of the first well 30 in a direction (an X direction and a Z direction) perpendicular to a thickness direction (the Y direction) of the semiconductor substrate 10 while a punch through breakdown voltage between the second well 32 and the semiconductor substrate 10 is saved. That is, an area that the LDMOS transistor 100T occupies can be reduced. As a result, an integration degree of the semiconductor device 1000 can be increased.

The second well 32 of P-type is formed in the first well 30 of N-type. The second well 32 can serve as a so-called body region. The second well 32 includes the impurity layer 40a of N-type serving as the source. In the region under the gate insulation film 50 in the second well 32, a region from an end of the impurity layer 40a of N-type to an end of the first well 30 of N-type serves as a channel region. The second well 32 is a retrograde well formed by a high energy ion implantation method. That is, the second well 32 of P-type is formed without a thermal diffusion process. Thus, the formation of the second well 32 of P-type can be readily controlled in the thickness direction (the Y direction) of the semiconductor substrate 10 as well as a direction (the X direction) perpendicular to the thickness direction. As a result, a channel having a desired length can be fabricated with high accuracy in the LDMOS transistor 100T The second well 32 can have a concentration profile, for example, similar to that, shown in FIG. 2, of the second well 34. That is, the second well 32 can have the high peak P2 in the deep portion (a side adjacent to the interface between the second well 32 and the semiconductor substrate 10). As a result, the LDMOS transistor 100T can suppress the operation of a parasitic bipolar transistor formed by the semiconductor substrate 10 of P-type, the first well 30 of N-type, and the second well 32 of P-type. In the second well 32, the impurity layer 42 can be formed to form a P-type contact.

The drain side offset insulation layer 22 can be formed in the second well 34 of N-type. On and above the drain side offset insulation layer 22, the gate insulation film 50 and the gate electrode 52 can be formed. That is, the gate of the LDMOS transistor 100T can be offset at a side adjacent to the drain. As a result, the LDMOS transistor 100T can have a high breakdown voltage. The drain side offset insulation layer 22 may be a LOCOS layer, a semi-recessed LOCOS layer, or a trench insulation layer, for example. In the example shown in FIG. 1, the drain side offset insulation layer 22 is a LOCOS layer.

The gate insulation film 50 can be formed on the first well 30 of N-type, the second well 32 of P-type, and the drain side offset insulation layer 22. The gate insulation film 50 is, for example, made of silicon oxide. The gate electrode 52 is formed on the gate insulation film 50. The gate electrode 52 is made of polysilicon, for example.

1.2 Offset Drain MOS Region

Next, the offset drain MOS region 200 is described. In the offset drain MOS region 200, as described above, the offset drain MOS transistor 200T having the P-type channel region is formed. The offset drain MOS transistor 200T includes the first well 30 of N-type, impurity layers 42a and 42b of P-type serving as a source and a drain, the drain side offset insulation layer 22, an offset layer 36 of P-type, the gate insulation film 50, and the gate electrode 52, as shown in FIG. 1. In addition, the offset drain MOS transistor 200T can include the second well 32 of P-type and the second well 34 of N-type that are retrograde wells.

The first well 30 of N-type is formed in the offset drain MOS region 200 of the semiconductor substrate 10 of P-type. The depth of the first well 30 is larger than that of the second wells 32 and 34. The first well 30 can electrically isolate, for example, the second well 32 of the offset drain MOS transistor 200T from the semiconductor substrate 10.

The second well 32 of P-type can be formed in the first well 30 of N-type. The second well 32 can serve as a so-called drift region. The second well 32 includes the impurity layer 42b of P-type serving as the drain. The second well 32 can have a concentration profile, for example, similar to that, shown in FIG. 2, of the second well 34 of the LDMOS region 100. As a result, the second well 32 can have functions to adjust the threshold value of the offset drain MOS transistor 200T, to suppress punch through, and to serve as a channel stopper. In addition, the second well 32 can have a function to lower the resistance in operation (ON resistance) of the offset drain MOS transistor 200T. In other words, the offset drain MOS transistor 200T can adjust the balance between the breakdown voltage and the resistance in the operation. Further, the offset drain MOS transistor 200T can suppress the operation of a parasitic bipolar transistor formed by the semiconductor substrate 10 of P-type, the first well 30 of N-type, and the second well 32 of P-type.

The second well 34 of N-type can be formed in the first well 30 of N-type. The second well 34 can serve as a so-called body region. The second well 34 can adjust the threshold value of the offset drain MOS transistor 200T. The second well 34 includes the impurity layer 42b of P-type serving as the source. In the second well 34 of N-type, an impurity layer 40 can be formed to form an N-type contact. The second well 34 is a retrograde well and has a concentration profile, for example, similar to that, shown in FIG. 2, of the second well 34 of the LDMOS region 100.

Figure 4:
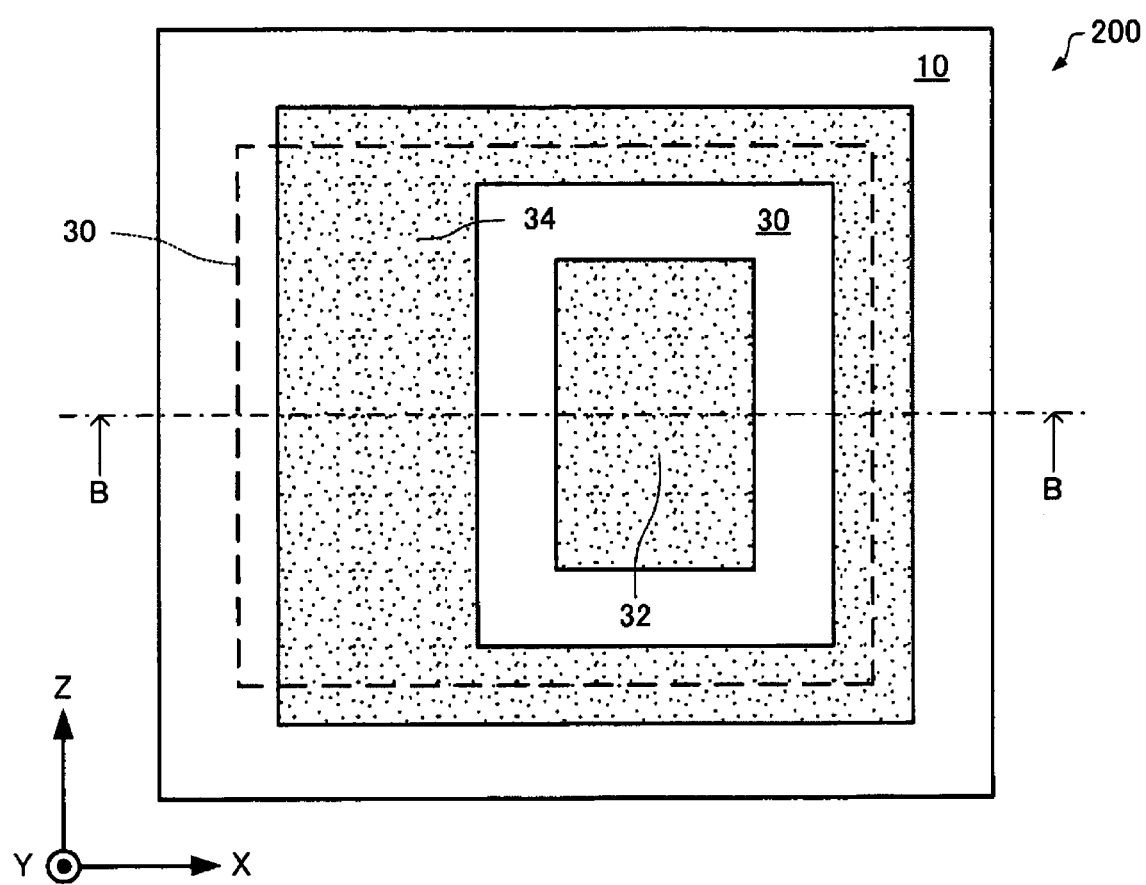
FIG. 4 is a sectional view schematically illustrating a part of the semiconductor device according to the embodiment.

FIG. 4 is a plan view schematically showing the offset drain MOS region 200 of the semiconductor device 1000. In FIG. 4, only the semiconductor substrate 10 of P-type, the first well 30 of N-type, the second well 34 of N-type and second well 32 of P-type are illustrated for the sake of convenience. Here, FIG. 1 is a sectional view taken along the line B-B of FIG. 4. The second well 34 is formed so as to surround the second well 32 in plan view as shown in FIG. 4. At least part of the periphery of the second well 34 is disposed outside of the periphery (dashed line) of the first well 30 in plan view. The impurity concentration of the second well 34 is larger than that of the first well 30. Therefore, having the second well 34, the offset drain MOS transistor 200T can reduce the widths of the first well 30 in the X direction and the Z direction of the first well 30 while the punch through breakdown voltage between the second well 32 and the semiconductor substrate 10 is saved. That is, an area that the offset drain MOS transistor 200T occupies can be reduced. As a result, an integration degree of the semiconductor device 1000 can be increased.

The drain side offset insulation layer 22 can be formed in the second well 32 of P-type. On and above the drain side offset insulation layer 22, the gate insulation film 50 and the gate electrode 52 can be formed. That is, the gate of the offset drain MOS transistor 200T can be offset at a side adjacent to the drain. As a result, the offset drain MOS transistor 200T can have a high breakdown voltage.

The offset layer 36 of P-type is formed under the drain side offset insulation layer 22 in the second well 32 of P-type. The impurity concentration in the offset layer 36 of P-type can be adjusted in a range to enable current to be flowed under the drain side offset insulation layer 22 while the breakdown voltage of the offset drain MOS transistor 200T is saved.

The gate insulation film 50 can be formed on the first well 30 of N-type, the second well 32 of P-type, and the drain side offset insulation layer 22. The gate electrode 52 is formed on the gate insulation film 50.

The second well 32 of P-type, which is a retrograde well, can be formed in the semiconductor substrate 10 of P-type between the LDMOS region 100 and the offset drain MOS region 200, for example. In the second well 32 of P-type, the impurity layer 42 can be formed to form a P-type contact. As a result, the potential of the semiconductor substrate 10 of P-type can be obtained.

1.3 CMOS Region

Next, the CMOS region 300 is described. In the CMOS region 300, as described above, the first MOS transistor 300T having the N-type channel region and the second MOS transistor 310T having the P-type channel region are formed.

First, the first MOS transistor 300T is described. The first MOS transistor 300T includes the second well 32 of P-type, which is a retrograde well, the impurity layers 40a and 40b of N-type serving as a source and a drain, the gate insulation film 50, and the gate electrode 52, as shown in FIG. 1. In addition, the first MOS transistor 300T can include the first well 30 of N-type.

The first well 30 of N-type is formed in the CMOS region 300 of the semiconductor substrate 10 of P-type. The depth of the first well 30 is larger than that of the second well 32. The first well 30 can differentiate the potential of the second well 32 from that of the semiconductor substrate 10. The first well 30 (not shown) may be not necessarily formed.

The second well 32 of P-type can be formed in the first well 30 of N-type. The second well 34 of P-type includes the impurity layers 40a and 40b of N-type serving as the source and the drain. In the second well 32 of P-type, the impurity layer 42 can be formed to form a P-type contact. The second well 34 is a retrograde well and has a concentration profile, for example, similar to that, shown in FIG. 2, of the second well 34 of the LDMOS region 100. As a result, the first MOS transistor 300T can suppress the operation of a parasitic bipolar transistor formed by the impurity layers 40a and 40b of N-type serving as the source and drain, the second well 32 of P-type, and the first well 30 of N-type.

The gate insulation film 50 is formed on an area of the second well 32 of P-type. The area serves as a channel region. The gate electrode 52 is formed on the gate insulation film 50.

Next, the second MOS transistor 310T is described. The second MOS transistor 310T includes the second well 34 of N-type, which is a retrograde well, the impurity layers 42a and 42b of P-type serving as a source and a drain, the gate insulation film 50, and the gate electrode 52, as shown in FIG. 1. In addition, the second MOS transistor 310T can include the first well 30 of N-type. Since the second MOS transistor 310T and the first MOS transistor 300T differ in the conductivity type, i.e., reversed each other, the detailed descriptions of the second MOS transistor 310T are omitted.

1.4 Bipolar Transistor Region

Next, the bipolar transistor region 400 is described. In the bipolar transistor region 400, as described above, the bipolar transistor 400T of NPN-type is formed. The bipolar transistor 400T of NPN-type includes the second well 34 of N-type, which is a retrograde well, a base layer 38 of P-type, an impurity layer 40c of N-type serving as a collector, and an impurity layer 40d of N-type serving as an emitter, as shown in FIG. 1.

The second well 34 of N-type is formed in the bipolar transistor region 400 of the semiconductor substrate 10 of P-type. The second well 34 is a retrograde well and has a concentration profile, for example, similar to that, shown in FIG. 2, of the second well 34 of the LDMOS region 100. As a result, the second well 34 can lower a collector resistance of the bipolar transistor 400T.

The base layer 38 of P-type is formed in the second well 34 of N-type. The base layer 38 is, for example, a retrograde well having a concentration profile. Therefore, as described above, the bipolar transistor 400T can suppress the operation of a parasitic bipolar transistor formed by the semiconductor substrate 10 of P-type, the second well 34 of N-type, and the base layer 38 of P-type. In the base layer 38, the impurity layer 42c of P-type is formed to form a contact with the base layer 38.

The impurity layer 40c of N-type, serving as the collector, is formed in the second well 34 of N-type. The impurity layer 40d of N-type, serving as the emitter, is formed in the base layer 38 of P-type.

The semiconductor device 1000 has the following features, for example.

The semiconductor device 1000 includes the second well 32 of P-type in the LDMOS region 100. The second well 32 of P-type is a retrograde well formed by a high energy ion implantation method. That is, the second well 32 of P-type is formed without a thermal diffusion process. Thus, the formation of the second well 32 of P-type can be readily controlled in the thickness direction (the Y direction) of the semiconductor substrate 10 as well as the direction (the X direction) perpendicular to the thickness direction. As a result, the LDMOS transistor 100T can be fabricated so as to have a channel having a desired length with high accuracy.

The semiconductor device 1000 includes the second well 32 of P-type in the LDMOS region 100, the offset drain MOS region 200, and the CMOS region 300. The second well 32 of P-type is a retrograde well having an impurity concentration profile in the depth direction (the Y direction). The impurity concentration of the second well 32 can be increased in the deep region (at a side adjacent to the interface between the second well 32 and the semiconductor substrate 10) compared to the other regions in the depth direction. As a result, the operation of the parasitic bipolar transistor formed by the semiconductor substrate 10 of P-type, the first well 30 of N-type, and the second well 32 of P-type can be suppressed. Likewise, the base layer 38 of P-type in the bipolar transistor region 400 is also formed by a high energy ion implantation method, and thus is a retrograde well. As a result, the operation of the parasitic bipolar transistor formed by the semiconductor substrate 10 of P-type, the second well 34 of N-type, and the base layer 38 of P-type can be suppressed.

The semiconductor device 1000 includes the second well 34 of N-type in the LDMOS region 100, and the second well 32 of P-type in the offset drain MOS region 200. Both the second wells 32 and 34 have the impurity concentration profiles in the depth direction (the Y direction), and thus are retrograde wells. As a result, both the second wells 32 and 34 can have functions to adjust the threshold value, to suppress punch through, and to serve as a channel stopper, as described above. In addition, both the second wells 32 and 34 can adjust the balance between the breakdown voltage and the resistance in the operation (ON resistance) of each of the LDMOS transistor 100T and the offset drain MOS transistor 200T.

The semiconductor device 1000 includes the second well 34 in the LDMOS region 100 and the offset drain MOS region 200 as being formed to surround the second well 32 in the LDMOS region 100 and the offset drain MOS region 200. At least part of the periphery of the second well 34 is disposed outside of the periphery of the first well 30 in plan view. The impurity concentration of the second well 34 is larger than that of the first well 30. Having the second well 34, the LDMOS transistor 100T as well as the offset drain MOS transistor 200T can reduce the width of the first well 30 in the direction (the X direction and the Z direction) perpendicular to the thickness direction (the Y direction) of the semiconductor substrate 10 while the punch through breakdown voltage between the second well 32 and the semiconductor substrate 10 is saved. That is, respective areas that the LDMOS transistor 100T and the offset drain MOS transistor 200T occupy can be reduced. As a result, the integration degree of the semiconductor device 1000 can be increased.

2. A Method for Manufacturing a Semiconductor Device.

A method for manufacturing the semiconductor device 1000 is described with reference to the accompanying drawings. FIGS. 5 to 10 are sectional views schematically showing manufacturing steps of the semiconductor device 1000.

Figure 5:
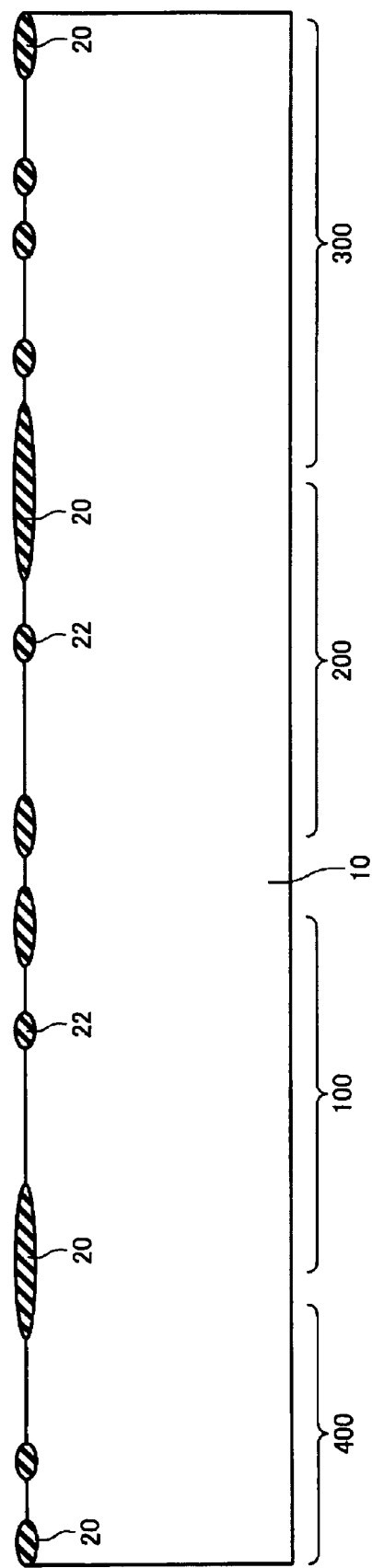
FIG. 5 is a sectional view schematically showing a manufacturing step of the semiconductor device of the embodiment.

As shown in FIG. 5, the element isolation insulation layer 20 is formed on the semiconductor substrate 10 of P-type for isolating the LDMOS region 100, the offset drain MOS region 200, the CMOS region 300, and the bipolar transistor region 400 from one another. In this regard, the drain side offset insulation layer 22 can be formed in the LDMOS region 100 and the offset drain MOS region 200 at the same time of forming the element isolation insulation layer 20, for example. The element isolation insulation layer 20 and the drain side offset insulation layer 22 are formed by a LOCOS method, for example. Specifically, as an example, a silicon nitride film (not shown) is formed on the semiconductor substrate 10. The silicon nitride film is patterned in a predetermined shape, and then, thermally oxidized.

Figure 6:
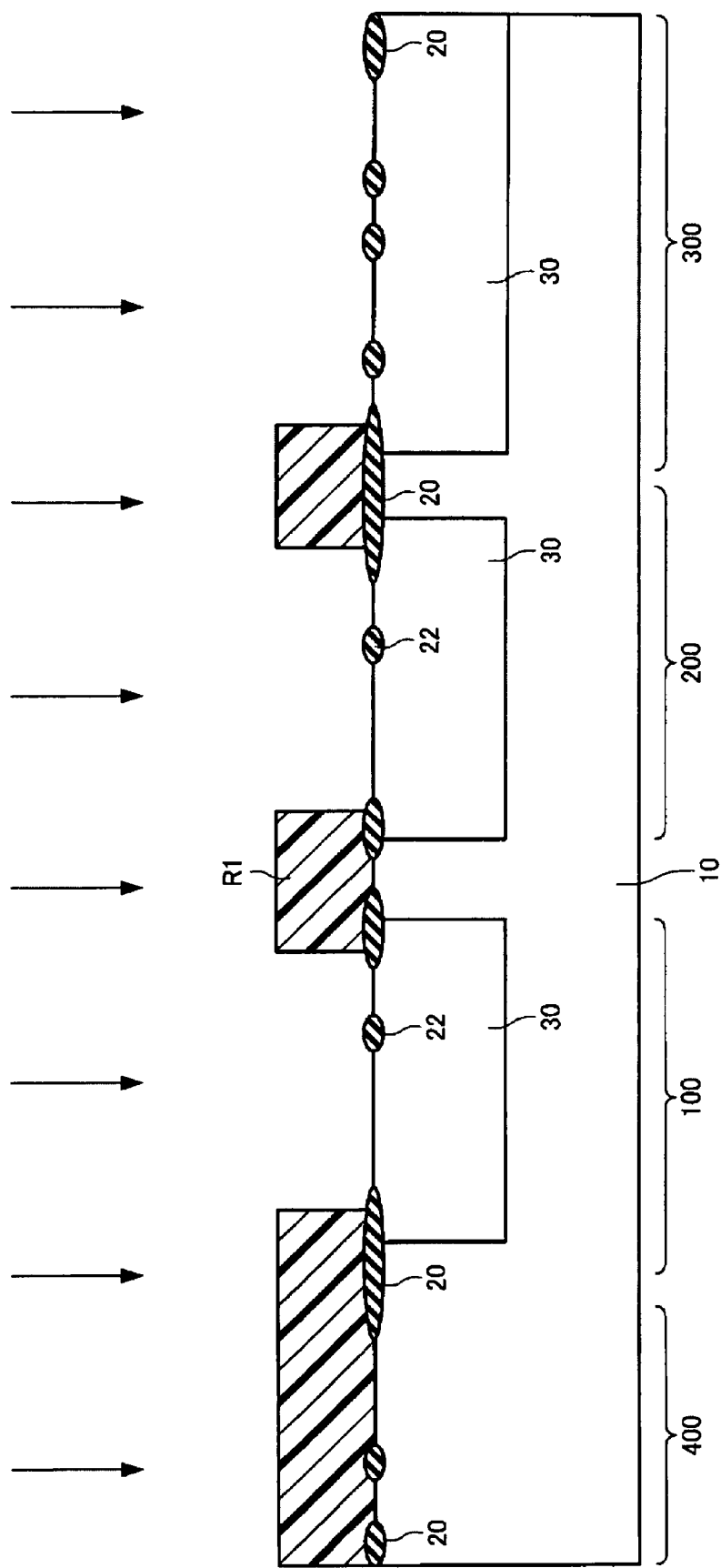
FIG. 6 is a sectional view schematically showing a manufacturing step of the semiconductor device of the embodiment.

As shown in FIG. 6, the first well 30 of N-type can be formed in the LDMOS region 100, the offset drain MOS region 200, and the CMOS region 300 simultaneously. The first well 30 of N-type is formed by a drive-in diffusion method, for example. Specifically, a resist layer R1 having a predetermined pattern is formed on the semiconductor substrate 10 of P-type. Impurities of N-type are implanted into the semiconductor substrate 10 at one time or several times using the resist layer R1 as a mask. Then, the resist layer R1 is removed by a known method. Then, the implanted impurities of N-type are thermally diffused by thermal treatment.

The first well 30 of N-type can also be formed by a high energy ion implantation method, for example. Specifically, a resist layer having a predetermined pattern (not shown) is formed on the semiconductor substrate 10 of P-type. Impurities of N-type are implanted into the semiconductor substrate 10 at several times using the resist layer as a mask. Then, the resist layer is removed by a known method. The high energy ion implantation method uses a highly accelerated voltage of 1 MeV to 5 MeV, for example. The high energy ion implantation method, thus, can implant impurities into a deep position without being thermally diffused.

Figure 7:
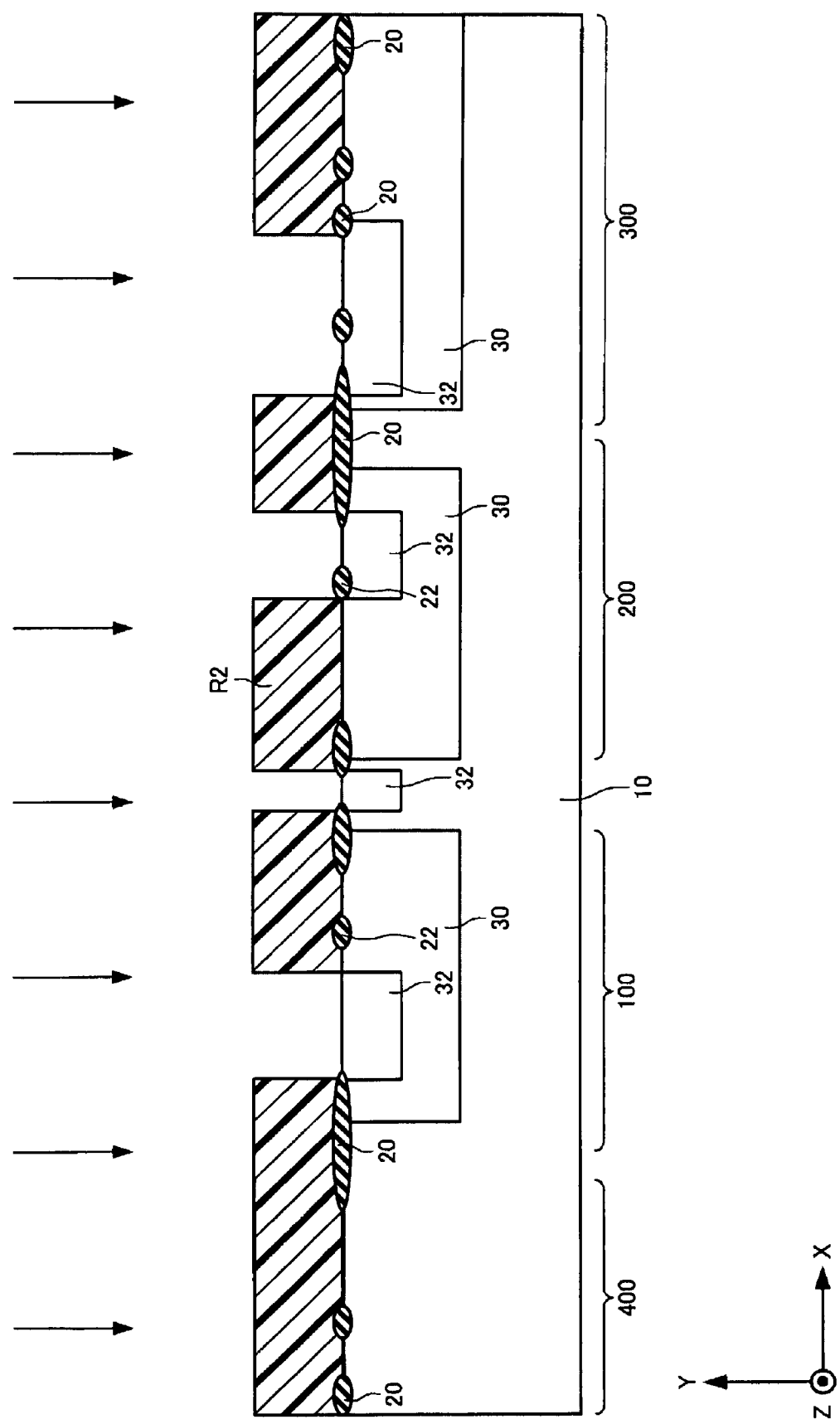
FIG. 7 is a sectional view schematically showing a manufacturing step of the semiconductor device of the embodiment.

As shown in FIG. 7, the second well 32 of P-type can be formed in the first well 30 of N-type in the LDMOS region 100, the offset drain MOS region 200, and the CMOS region 300 simultaneously. The second well 32 of P-type can also be formed in the semiconductor substrate 10 of P-type between the LDMOS region 100 and the offset drain MOS region 200 simultaneously. The second well 32 is formed by a high energy ion implantation method. Specifically, a resist layer R2 having a predetermined pattern is formed on the semiconductor substrate 10 of P-type. Impurities of P-type are implanted into the semiconductor substrate 10 at several times using the resist layer R2 as a mask. Then, the resist layer R2 is removed by a known method. As a result, the second well 32 is formed as a retrograde well having an impurity concentration, as exemplarily shown in FIG. 2, in the depth direction (the Y direction). The high peak P2 shown in FIG. 2 can be formed by implanting impurities by an accelerated voltage of 1 MeV to 5 MeV, for example.

The second well 32 of P-type is formed by a so-called rotational ion implantation method. The process of forming the second-well 32 of P-type includes two steps. The first one is a step in which ions are implanted from a first direction slanted with respect to the thickness direction of the semiconductor substrate 10, and the second is a step in which ions are implanted from a second direction, different from the first direction, slanted with respect to the thickness direction of the semiconductor substrate 10. In ion implantation steps, while an ion irradiation direction is fixed, a wafer including the semiconductor substrate 10 is relatively moved to the irradiation direction. As a result, ions can be implanted from the first and second directions. Implanting the ions from directions slanted to the thickness direction of the semiconductor substrate 10 can prevent the implanted ions from being channeled in the semiconductor substrate 10.

Hereinafter, the details are specifically described. In the process of forming the second well 32 of P-type, a wafer 1 is irradiated with ions ejected from an ion irradiation nozzle 5 as shown in FIGS. 8A to 8D. The process of forming the second well 32 of P-type can include first, second, third, and fourth implantation steps.

Figure 8A:
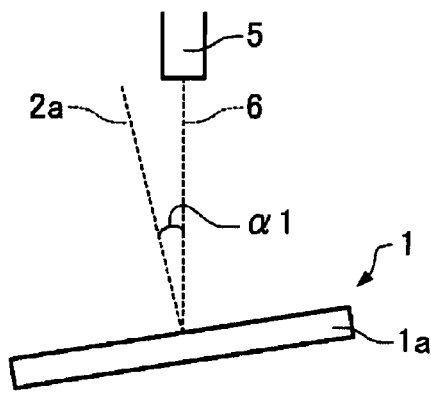
FIGS. 8A to 8D are sectional views schematically showing a manufacturing step of the semiconductor device of the embodiment.

In the first implantation step shown in FIG. 8A, the wafer 1 is slanted with respect to an axis 6 in an irradiation direction of ions. An axis 2a in the thickness direction of the semiconductor substrate 10 and the axis 6 in the ion irradiation direction can be set at an angle $\alpha 1$ of 5 to 10 degrees. With this condition, one-fourth of the total ion implantation amount can be implanted. Here, FIG. 8A shows a side 1a of the wafer 1.

Figure 8B:
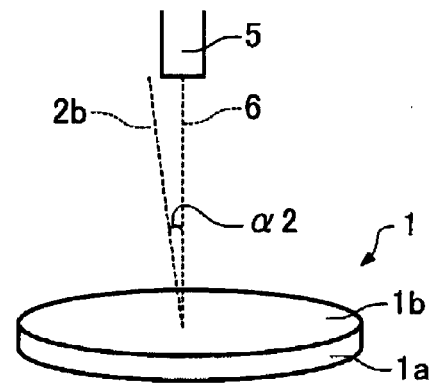

In the second implantation step shown in FIG. 8B, the axis 2a in the thickness direction of the semiconductor substrate 10 shown in FIG. 8A (in the first implantation step) is rotated by 90 degrees around the axis 6 in the ion irradiation direction as a center so as to be defined as an axis 2b in the thickness direction of the semiconductor substrate 10. That is, the axis 2a in the thickness direction of the semiconductor substrate 10 in the first implantation step and the axis 2b in the thickness direction of the semiconductor substrate 10 in the second implantation step make an angle of 90 degrees when viewed from the ion irradiation direction. The axis 2a in the thickness direction of the semiconductor substrate 10 is rotated by moving the wafer 1 while the ion irradiation direction is fixed, for example. The axis 2b in the thickness direction of the semiconductor substrate 10 and the axis 6 in the ion irradiation direction can be set at an angle $\alpha 2$ of 5 to 10 degrees. With this condition, one-fourth of the total ion implantation amount can be implanted. Here, FIG. 8B shows the side 1a and a front face 1b of the wafer 1.

Figure 8C:
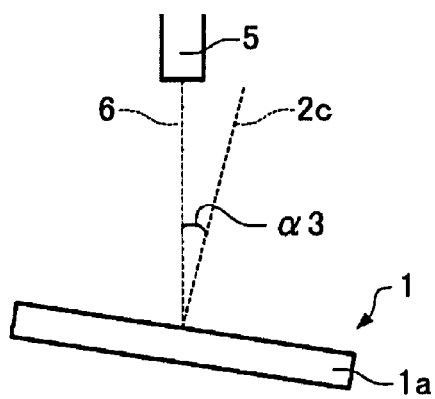

In the third step shown in FIG. 8C, the axis 2a in the thickness direction of the semiconductor substrate 10 in the first implantation step is rotated by 180 degrees around the axis 6 in the ion irradiation direction as a center so as to be defined as an axis 2c in the thickness direction of the semiconductor substrate 10. That is, the axis 2a in the thickness direction of the semiconductor substrate 10 in the first implantation step and the axis 2c in the thickness direction of the semiconductor substrate 10 in the third implantation step make an angle of 180 degrees when viewed from the ion irradiation direction. The axis 2a in the thickness direction of the semiconductor substrate 10 is rotated by moving the wafer 1 while the ion irradiation direction is fixed, for example. The axis 2c in the thickness direction of the semiconductor substrate 10 and the axis 6 in the ion irradiation direction can be set at an angle $\alpha 3$ of 5 to 10 degrees. With this condition, one-fourth of the total ion implantation amount can be implanted. Here, FIG. 8C shows the side 1a of the wafer 1.

Figure 8D:
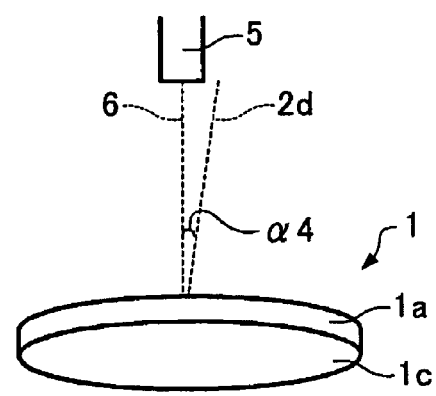

In the fourth implantation step shown in FIG. 8D, the axis 2a in the thickness direction of the semiconductor substrate 10 in the first implantation step is rotated by 270 degrees around the axis 6 in the ion irradiation direction as a center so as to be defined as an axis 2d in the thickness direction of the semiconductor substrate 10. That is, the axis 2a in the thickness direction of the semiconductor substrate 10 in the first implantation step and the axis 2d in the thickness direction of the semiconductor substrate 10 in the fourth implantation step make an angle of 270 degrees when viewed from the ion irradiation direction. The axis 2a in the thickness direction of the semiconductor substrate 10 is rotated by moving the wafer 1 while the ion irradiation direction is fixed, for example. The axis 2d in the thickness direction of the semiconductor substrate 10 and the axis 6 in the ion irradiation direction can be set at an angle α4 of 5 to 10 degrees. With this condition, one-fourth of the total ion implantation amount can be implanted. Here, FIG. 8D shows the side 1a and a rear face 1c of the wafer 1.

As a result, the arrangement of the LDMOS transistor 100T, the offset drain MOS transistor 200T, and the MOS transistors 300T and 400T does not cause the characteristics to fluctuate, so that the semiconductor device 1000 can be provided that has stable characteristics and few variations in the characteristics.

Figure 9:
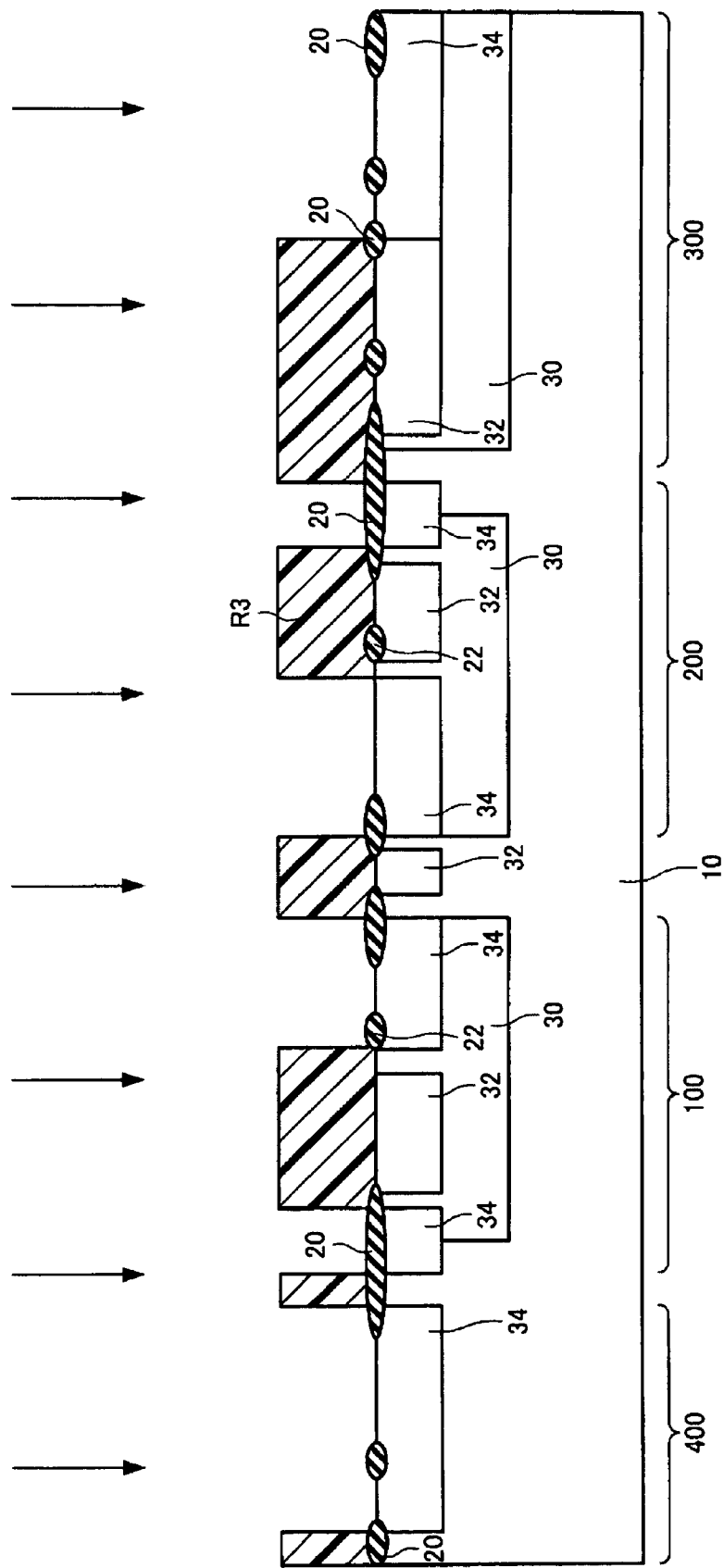
FIG. 9 is a sectional views schematically showing a manufacturing step of the semiconductor device of the embodiment.

As shown in FIG. 9, the second well 34 of N-type can be simultaneously formed in the first well 30 of N-type in the LDMOS region 100, the first well 30 of N-type in the offset drain MOS region 200, the first well 30 of N-type in the CMOS region 300, and the bipolar transistor region 400. The second well 34 is formed by a high energy ion implantation method. Specifically, a resist layer R3 having a predetermined pattern is formed on the semiconductor substrate 10 of P-type. Impurities of N-type are implanted into the semiconductor substrate 10 at several times using the resist layer R3 as a mask. Then, the resist layer R3 is removed by a known method. The accelerated voltage in ion implanting is the same of that in forming the second well 32 of P-type, for example. As a result, the second well 34 of N-type can serve as a retrograde well having an impurity concentration profile in the depth direction in the same manner of the second well 32 of P-type, for example. The high energy ion implantation method can employ a so-called rotational ion implantation, as described above. Here, the step of forming the second well 32 of P-type and the step of forming the second well 34 of N-type are conducted regardless of the order of the steps.

Figure 10:
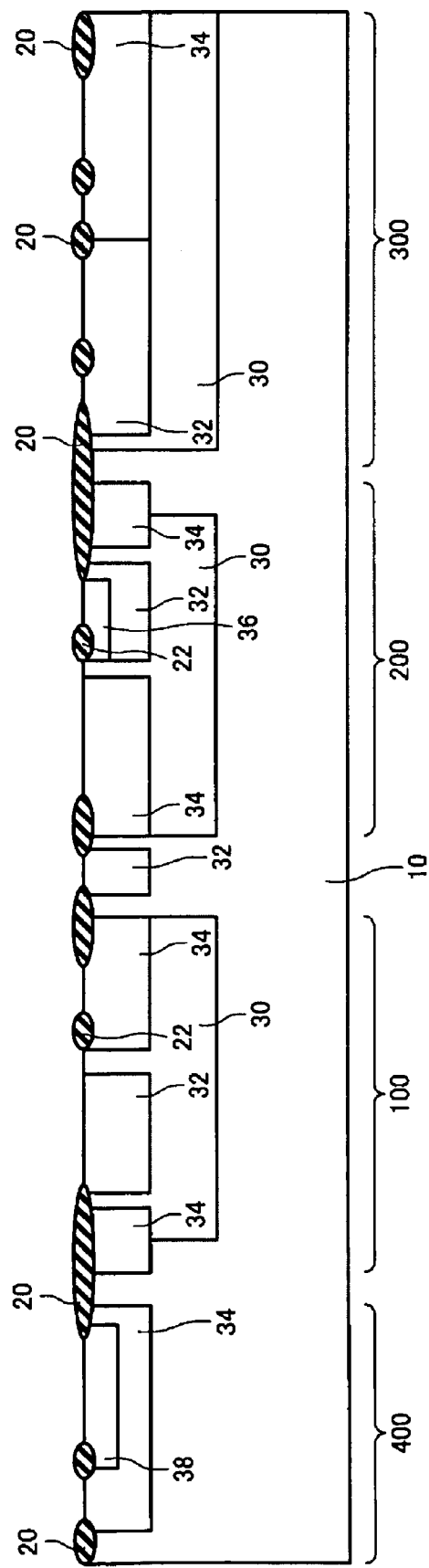
FIG. 10 is a sectional views schematically showing a manufacturing step of the semiconductor device of the embodiment.

As shown in FIG. 10, the offset layer 36 of P-type is formed under the drain side offset insulation layer 22 in the second well 32 of P-type of the offset drain MOS region 200, and simultaneously, the base layer 38 of P-type is formed in the second well 34 of N-type of the bipolar transistor region 400. The offset layer 36 and the base layer 38 can be formed by a high energy ion implantation method, for example.

Figure 11:
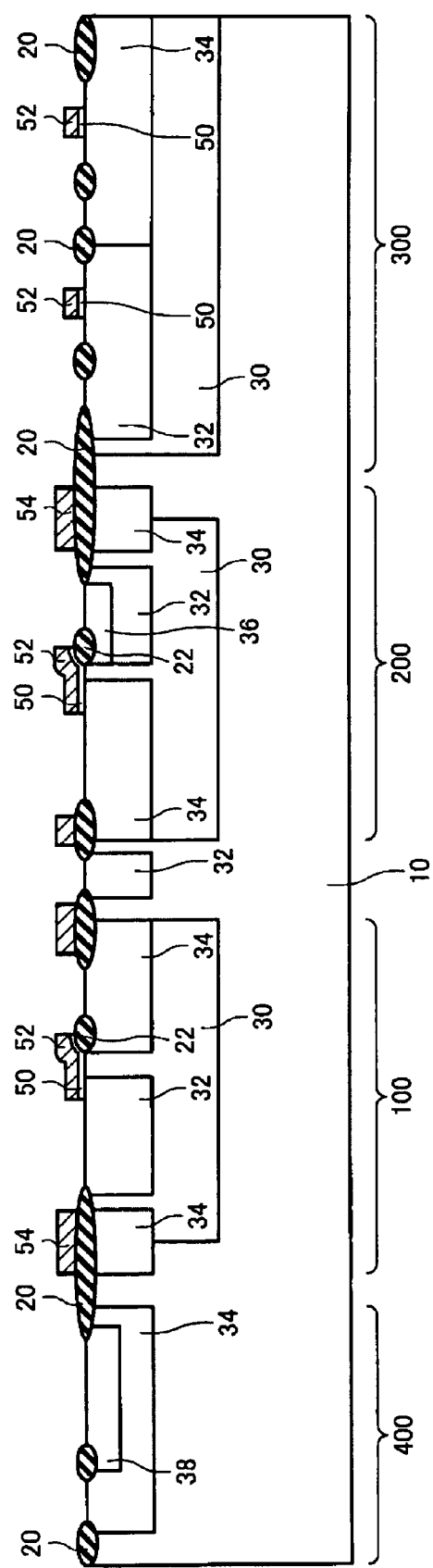
FIG. 11 is a sectional views schematically showing a manufacturing step of the semiconductor device of the embodiment.

As shown in FIG. 11, the gate insulation film 50 is formed. The gate insulating layer 50 is formed by, for example, a thermal oxidation method. Then, a polysilicon layer (not shown) is entirely formed. Thereafter, a resist layer (not shown) having a predetermined pattern is formed on the polysilicon layer. The polysilicon layer is patterned with the resist layer as a mask to form the gate electrode 52 and the conductive layer 54 as shown in FIG. 11.

Figure 12:
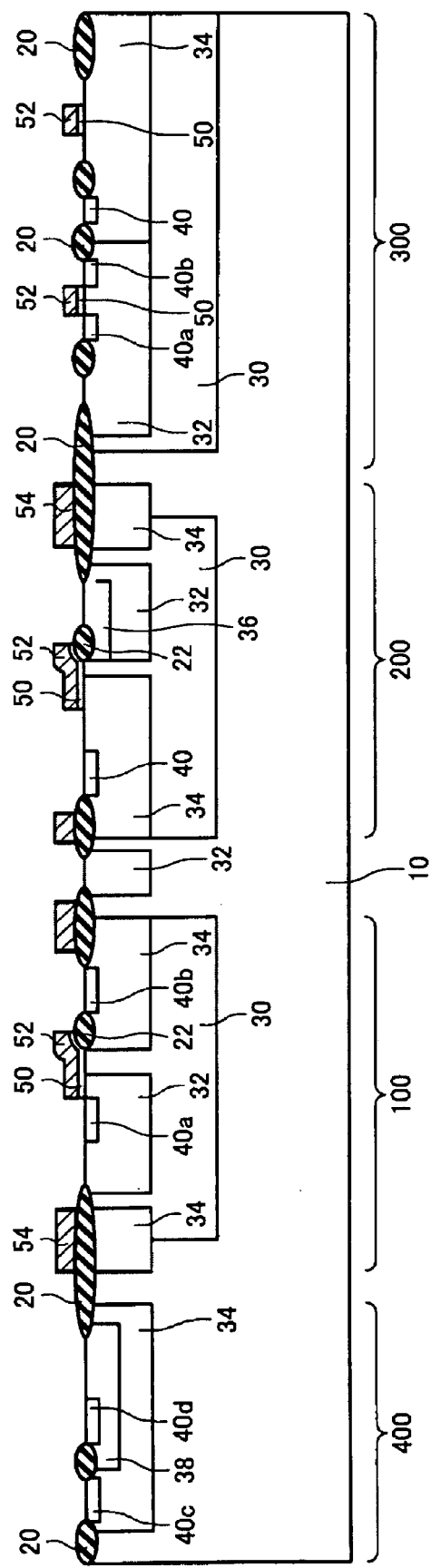
FIG. 12 is a sectional views schematically showing a manufacturing step of the semiconductor device of the embodiment.

As shown in FIG. 12, the impurity layers 40, 40a, 40b, 40c, and 40d each of N-type are simultaneously formed in the corresponding areas in the second well 32 of P-type as well as the second well 34 of N-type of the LDMOS region 100, the second well 34 of N-type of the offset drain MOS region 200, the second sell 32 of P-type as well as the second well 34 of N-type of the CMOS region 300, and the second well 34 of N-type as well as the base layer 38 of P-type of the bipolar transistor region 400. The impurity layers 40, 40a, 40b, 40c, and 40d each of N-type can be formed by implanting predetermined impurities after forming a resist layer (not shown) using a known lithographic technique so as to be used as a mask.

Figure 13:
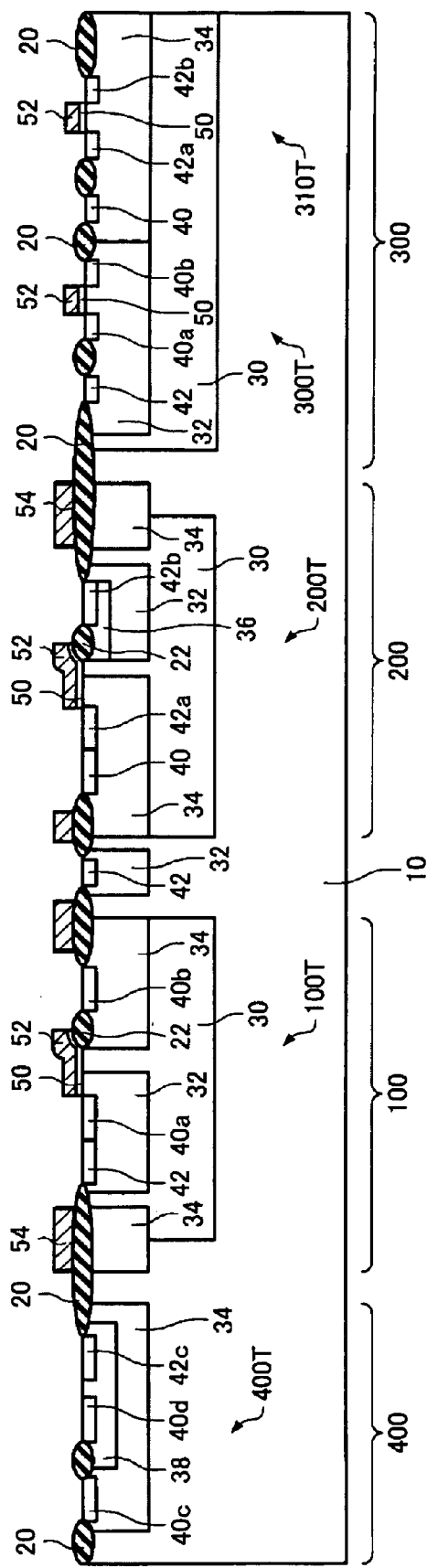
FIG. 13 is a sectional views schematically showing a manufacturing step of the semiconductor device of the embodiment.

As shown in FIG. 13, the impurity layers 42, 42a, 42b, and 42c each of P-type are simultaneously formed in the corresponding areas in the second well 32 of P-type of the LDMOS region 100, the second well 32 of P-type as well as the second well 34 of N-type of the offset drain MOS region 200, the second sell 32 of P-type as well as the second well 34 of N-type of the CMOS region 300, and the base layer 38 of P-type of the bipolar transistor region 400. The impurity layer 42 of P-type can be simultaneously formed in the second well 32 of P-type between the LDMOS region 100 and the offset drain MOS region 200. The impurity layers 42, 42a, 42b, and 42c each of P-type can be formed by implanting predetermined impurities after forming a resist layer (not shown) using a known lithographic technique so as to be used as a mask. Here, the step of forming impurity layers 40, 40a, 40b, 40c, and 40d each of N-type and the step of forming the impurity layers 42, 42a, 42b, and 42c each of P-type are conducted regardless of the order of the steps.

As shown in FIG. 1, the interlayer insulation film 60 is formed on the semiconductor substrate 10. The interlayer insulation film 60 is formed by chemical vapor deposition (CVD), or coating, for example. Then, the contact holes 70 are formed in the interlayer insulation film 60. The contact holes 70 are formed by known photolithographic technique and etching technique, for example. Next, the contacts 72 are formed in the contact holes 70. The wiring layer 74 is then formed on the contacts 72. The contacts 72, and the wiring layer 74 are formed by plating, or sputtering, for example. Then, the protective film 62 is formed on the interlayer insulation film 60 and the wiring layer 74. The protective film 62 is formed by CVD, for example.

Through the above steps, the semiconductor device 1000 is manufactured.

The method for manufacturing the semiconductor device 1000 has the following features, for example.

In the method for manufacturing the semiconductor device 1000, the second well 32 of P-type and the second well 34 of N-type are formed by rotational ion implanting as a high energy ion implantation method. That is, ions can be implanted while the axis 2 in the thickness direction of the semiconductor substrate 10 is slanted with respect to the axis 6 in the ion irradiation direction in the first to fourth implantation steps. More specifically, ions can be implanted while the axis 2a in the thickness direction of the semiconductor substrate 10 in the first implantation step is rotated by 90 degrees around the axis 6 in the ion irradiation axis in each step. In each implantation step, one-fourth of the total ion implantation amount can be implanted. These steps can prevent the implanted ions from being channeled in the semiconductor substrate 10, and allows the characteristics of the semiconductor device 1000 to be free from the fluctuation caused by the arrangement of the LDMOS transistor 100T, the offset drain MOS transistor 200T, the MOS transistors 300T and 310T, and the bipolar transistor 400T. As a result, the semiconductor device 1000 can be provided that has good characteristics and high reliability.

In the method for manufacturing the semiconductor device 1000, the second well 32 of P-type can be formed in each of the LDMOS region 100, the drain offset MOS region 200, and the CMOS region 300 in a common step. The second well 34 of N-type can also be formed in each of the LDMOS region 100, the drain offset MOS region 200, the CMOS region 300, and the bipolar transistor region 400 in a common step. Consequently, by a simplified process, the semiconductor device 1000 can be formed in which the LDMOS transistor 100T, the offset drain MOS transistor 200T, the MOS transistors 300T and 310T, and the bipolar transistor 400T are mixedly fabricated.

As understood by those skilled in the art, various changes can be made with the embodiments of the invention that have been described in detail without departing from the spirit and scope of the invention. Therefore, it is to be noted that these modifications are all included in the scope of the invention.

What is claimed is:

1. A method for manufacturing a semiconductor device, comprising:
    (a) forming an element isolation insulation layer in a semiconductor substrate of a first conductivity type to isolate a laterally diffused metal oxide semiconductor (LDMOS) region, an offset drain metal oxide semiconductor (MOS) region, and a complementary metal oxide semiconductor (CMOS) region from one another;
    (b) forming a drain side offset insulation layer in the LDMOS region and the offset drain MOS region;
    (c) simultaneously forming a first well of a second conductivity type in the LDMOS region and the offset drain MOS region;
    (d) simultaneously forming a second well of the first conductivity type in the first well of the LDMOS region and the CMOS region;
    (e) forming the second well of the second conductivity type in the CMOS region;
    (f) forming an offset later of the first conductivity type under the drain side offset insulation layer of the offset drain MOS region;
    (g) forming in the second well of the first conductivity type of the LDMOS region a first impurity layer of the second conductivity type, the first impurity layer serving as a source;
    (h) forming in the first well of the second conductivity type of the LDMOS the first impurity layer of the second conductivity type, the first impurity layer serving as a drain;
    (i) forming in the second well of the first conductivity type of the CMOS region the first impurity layer of the second conductivity type, the first impurity layer serving as a source and a drain, wherein the steps (g), (h), and (i) are simultaneously conducted;
    (j) forming in the first well of the second conductivity type of the offset drain MOS region a second impurity layer of the first conductivity type, the second impurity layer serving as a source and a drain; and
    (k) forming in the second well of the second conductivity type of the CMOS region the second impurity layer of the first conductivity type, the second impurity layer serving as a source and drain, wherein steps (j) and (k) are simultaneously conducted, and
wherein a depth of the first well is larger than a depth of the second well, and the second well is a retrograde well formed by a high energy ion implantation method.

2. The method for manufacturing a semiconductor device according to claim 1 further comprising:
    (l) forming a LDMOS transistor having a channel region of the second conductivity type in the LDMOS region;
    (m) forming an offset drain MOS transistor having a channel region of the first conductivity type in the offset drain MOS region; and
    (n) forming a first MOS transistor having a channel region of the first conductivity type and a second MOS transistor having a channel region of the second conductivity type in the CMOS region.

3. The method for manufacturing a semiconductor device according to claim 1, wherein the steps (d) and (e) further including:
    (o) conducting an ion implanting from a first direction slanted with respect to a thickness direction of the semiconductor substrate; and
    (p) conducting an ion implantation from a second direction slanted with respect to the thickness direction of the semiconductor substrate, the second direction being different from the first direction.

4. The method for manufacturing a semiconductor device according to claim 3, wherein the steps (o) and (p) are conducted while an ion irradiation direction is fixed, a wafer including the semiconductor substrate is relatively moved to the ion irradiation direction.

5. The method for manufacturing a semiconductor device according to claim 4, wherein the steps (o) and (p) further including:
    (q) conducting an ion implantation while a first axis in the thickness direction of the semiconductor substrate is slanted with respect to a second axis in the ion irradiation direction;
    (r) conducting an ion implantation while the first axis in the thickness direction of the semiconductor substrate in step (q) is rotated by 90 degrees around the second axis in the ion irradiation direction as a center;
    (s) conducting an ion implantation while the first axis in the thickness direction of the semiconductor substrate in step (q) is rotated by 180 degrees around the second axis in the ion irradiation direction as the center; and
    (t) conducting an ion implantation while the first axis in the thickness direction of the semiconductor substrate in step (q) is rotated by 270 degrees around the second axis in the ion irradiation direction as the center.

6. The method for manufacturing a semiconductor device according to claim 5, wherein, in each of the steps (q) to (t), one-fourth of a total ion implantation amount is implanted.

7. The method for manufacturing a semiconductor device according to claim 1, wherein, in the step (d), the second well of the first conductivity type is simultaneously formed in the first well of the offset drain MOS region; and the second impurity layer of the first conductivity type serving as the drain is formed in the second well of the first conductivity type of the offset drain MOS region.

8. The method for manufacturing a semiconductor device according to claim 1, wherein, in the step (e), the second well of the second conductivity type is simultaneously formed in the first well of the offset drain MOS region; and the second impurity layer of the first conductivity type serving as the source is formed in the second well of the second conductivity type of the offset drain MOS region.

9. The method for manufacturing a semiconductor device according to claim 1, wherein:
    in the step (d), the second well of the first conductivity type is simultaneously formed in the first well of the offset drain MOS region, and the second well of the second conductivity type is simultaneously formed in the first well of the offset drain MOS region; and
    in the step (e), the second impurity layer of the first conductivity type serving as the drain is formed in the second well of the first conductivity type of the offset drain MOS region, and the second impurity layer of the first conductivity type serving as the source is formed in the second well of the second conductivity type of the offset drain MOS region, and
wherein:

the second well of the second conductivity type of the offset drain MOS region is formed so as to surround the second well of the first conductivity type of the offset drain MOS region in plan view; and at least part of a periphery of the second well of the second conductivity type of the offset drain MOS region is disposed outside of a periphery of the first well of the offset drain MOS region; and the second well of the second conductivity type of the offset drain MOS region has an impurity concentration larger than an impurity concentration of the first well of the offset drain MOS region.

10. The method for manufacturing a semiconductor device according to claim 1, wherein, in the step (e), the second well of the second conductivity type is simultaneously formed in the first well of the LDMOS region; and the first impurity layer of the second conductivity type serving as the drain is formed in the second well of the second conductivity type of the LDMOS region.

11. The method for manufacturing a semiconductor device according to claim 10, wherein:
the second well of the second conductivity type of the LDMOS region is formed so as to surround the second well of the first conductivity type of the LDMOS region in plan view; and
at least part of a periphery of the second well of the second conductivity type of the LDMOS region is disposed outside of a periphery of the first well of the LDMOS region; and
the second well of the second conductivity type of the LDMOS region has an impurity concentration larger than an impurity concentration of the first well of the LDMOS region.

12. The method for manufacturing a semiconductor device according to claim 1, wherein, in the step (c), the first well of the second conductivity type is simultaneously formed in the CMOS region; and the second well of the first conductivity type and the second well of the second conductivity type are formed in the first well of the CMOS region.

13. The method for manufacturing a semiconductor device according to claim 1, wherein:
in the step (a), an element isolation insulation layer is formed so as to isolate a bipolar transistor region from other regions;
in the step (e), the second well of the second conductivity type is simultaneously formed in the bipolar transistor region;
the method further including forming a base layer of the first conductivity type in the second well of the bipolar transistor region; and
in the step (g), the first impurity layer of the second conductivity type is simultaneously formed in the second well of the second conductivity type of the bipolar transistor region so as to serve as a collector and in the base layer so as to serve as an emitter.

14. The method for manufacturing a semiconductor device according to claim 13, wherein a bipolar transistor of a vertical-type is formed in the bipolar transistor region.

15. The method for manufacturing a semiconductor device according to claim 13, wherein the offset layer and the base layer are simultaneously formed.

16. The method for manufacturing a semiconductor device according to claim 1, wherein the first well is formed by a drive-in diffusion method.

17. The method for manufacturing a semiconductor device according to claim 1, wherein the first well is formed by a high energy ion implantation method.

18. A semiconductor device, comprising:
a semiconductor substrate of a first conductivity type;
an element isolation insulation layer that is formed on the semiconductor substrate, and isolates a laterally diffused metal oxide semiconductor (LDMOS) region, an offset drain metal oxide semiconductor (MOS) region, and a complementary metal oxide semiconductor (CMOS) region from one another;
a drain side offset insulation layer formed in the LDMOS region and the offset drain MOS region;
a first well of a second conductivity type formed in the LDMOS region and the offset drain MOS region;
a second well of the first conductivity type formed in the first well of the LDMOS region and the CMOS region;
a second well of the second conductivity type formed in the CMOS region;
an offset layer of the first conductivity type formed under the drain side offset insulation layer of the offset drain MOS region; and
a first impurity layer of the second conductivity type that is formed in the second well of the first conductivity type of the LDMOS region so as to serve as a source, in the first well of the second conductivity type of the LDMOS region so as to serve as a drain, and in the second well of the first conductivity type of the CMOS region so as to serve as a source and a drain;
a second impurity layer of the first conductivity type that is formed in the first well of the offset drain MOS region so as to serve as a source and a drain, and in the second well of the second conductivity type of the CMOS region so as to serve as a source and a drain, wherein a depth of the first well is larger than a depth of the second well, and the second well is a retrograde well formed by a high energy ion implantation method.

19. A method for manufacturing a semiconductor device, comprising:
forming an element isolation insulation layer in a semiconductor substrate of a first conductivity type to isolate a laterally diffused metal oxide semiconductor (LDMOS) region, an offset drain metal oxide semiconductor (MOS) region, and a complementary metal oxide semiconductor (CMOS) region from one another;
simultaneously forming a first well of a second conductivity type in the LDMOS region and the offset drain MOS region;
simultaneously forming a second well of the first conductivity type in the first well of the LDMOS region and the CMOS region;
forming a second well of the second conductivity type in the CMOS region, wherein a depth of the first well is larger than a depth of the second well and the second well is a retrograde well formed by a high energy ion implantation method.

* * * * *